(12) United States Patent
Xie et al.

(10) Patent No.: US 10,998,234 B2
(45) Date of Patent: May 4, 2021

(54) NANOSHEET BOTTOM ISOLATION AND SOURCE OR DRAIN EPITAXIAL GROWTH

(71) Applicant: International Business Machines Corporation, Armonk, NY (US)

(72) Inventors: Ruilong Xie, Niskayuna, NY (US); Veeraraghavan Basker, Schenectady, NY (US); Nicolas Loubet, Guilderland, NY (US); Balasubramanian Pranatharthiharan, Watervliet, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/411,350

(22) Filed: May 14, 2019

(65) Prior Publication Data

US 2020/0365687 A1 Nov. 19, 2020

(51) Int. Cl.
*H01L 21/8234* (2006.01)
*H01L 29/06* (2006.01)
(Continued)

(52) U.S. Cl.
CPC .......... *H01L 21/823431* (2013.01); *H01L 21/02532* (2013.01); *H01L 21/02609* (2013.01);
(Continued)

(58) Field of Classification Search
CPC ........... H01L 21/8232; H01L 21/8234; H01L 21/823412; H01L 21/823431; H01L 21/823481; H01L 21/823487; H01L 21/8236; H01L 21/8238; H01L 21/823821; H01L 21/823878; H01L 21/823885; H01L 21/845; H01L 27/0886; H01L 27/0924; H01L 27/10879; H01L 27/1211; H01L 29/41791; H01L 29/66772; H01L 29/66795; H01L 29/7831; H01L 29/785; H01L 29/7853
See application file for complete search history.

(56) References Cited

U.S. PATENT DOCUMENTS 9,349,658 B1 * 5/2016 Jacob ................. H01L 29/6656
9,397,166 B2 * 7/2016 Le ..................... H01L 29/78684
(Continued)

OTHER PUBLICATIONS

Loubet et al., "Stacked Nanosheet Gate-All-Around Transistor to Enable Scaling Beyond FinFET," 2017 Symposium on VLSI Technology Digest of Technical Papers; 2 pages.

*Primary Examiner* — Eduardo A Rodela
(74) *Attorney, Agent, or Firm* — Cantor Colburn LLP; Douglas Pearson

(57) ABSTRACT

Embodiments of the present invention are directed to a method that prevents punch-through of a bottom isolation layer and improves the quality of the source/drain epitaxial growth in a nanosheet semiconductor structure. In a non-limiting embodiment of the invention, a bottom isolation structure is formed over a substrate. The bottom isolation structure includes a tri-layer stack in a first region of the substrate and a bi-layer stack in a second region of the substrate. A nanosheet stack is formed over the bottom isolation structure in the first region of the substrate. A gate is formed over a channel region of the nanosheet stack.

20 Claims, 13 Drawing Sheets

(51) Int. Cl.
*H01L 21/84* (2006.01)
*H01L 21/02* (2006.01)
*H01L 29/40* (2006.01)
*H01L 29/08* (2006.01)
*H01L 21/762* (2006.01)
*H01L 29/66* (2006.01)
*H01L 27/12* (2006.01)
*H01L 21/3065* (2006.01)
*H01L 29/417* (2006.01)
*H01L 29/78* (2006.01)
*H01L 27/088* (2006.01)
*H01L 27/108* (2006.01)
*H01L 21/311* (2006.01)

(52) U.S. Cl.
CPC .... *H01L 21/3065* (2013.01); *H01L 21/76283* (2013.01); *H01L 21/823481* (2013.01); *H01L 21/845* (2013.01); *H01L 27/0886* (2013.01); *H01L 27/10879* (2013.01); *H01L 27/1211* (2013.01); *H01L 29/0673* (2013.01); *H01L 29/0847* (2013.01); *H01L 29/401* (2013.01); *H01L 29/41791* (2013.01); *H01L 29/6656* (2013.01); *H01L 29/66545* (2013.01); *H01L 29/7853* (2013.01); *H01L 21/0262* (2013.01); *H01L 21/31116* (2013.01)

(56) References Cited

U.S. PATENT DOCUMENTS

| | | | |
|---|---|---|---|
| 9,620,590 | B1 | 4/2017 | Bergendahl et al. |
| 9,741,792 | B2 | 8/2017 | Cheng et al. |
| 9,761,722 | B1 | 9/2017 | Jagannathan et al. |
| 9,881,998 | B1 | 1/2018 | Cheng et al. |
| 9,947,804 | B1 | 4/2018 | Frougier et al. |
| 9,984,936 | B1 | 5/2018 | Xie et al. |
| 9,997,519 | B1 * | 6/2018 | Bao .................. H01L 29/4966 |
| 10,170,638 | B1 | 1/2019 | Reznicek |
| 10,211,322 | B1 * | 2/2019 | Kim .................. H01L 29/78696 |
| 2016/0071729 | A1 * | 3/2016 | Hatcher ............ H01L 29/42392 257/347 |
| 2017/0110554 | A1 * | 4/2017 | Tak .................... H01L 29/42392 |
| 2017/0133459 | A1 | 5/2017 | Pranatharthiharan et al. |
| 2018/0061766 | A1 * | 3/2018 | Goktepeli ............ H01L 23/481 |
| 2018/0261670 | A1 * | 9/2018 | Yeung ................ H01L 29/0673 |
| 2020/0126987 | A1 * | 4/2020 | Rubin ................ H01L 29/0673 |
| 2020/0135575 | A1 * | 4/2020 | Greene ........... H01L 21/823481 |

* cited by examiner

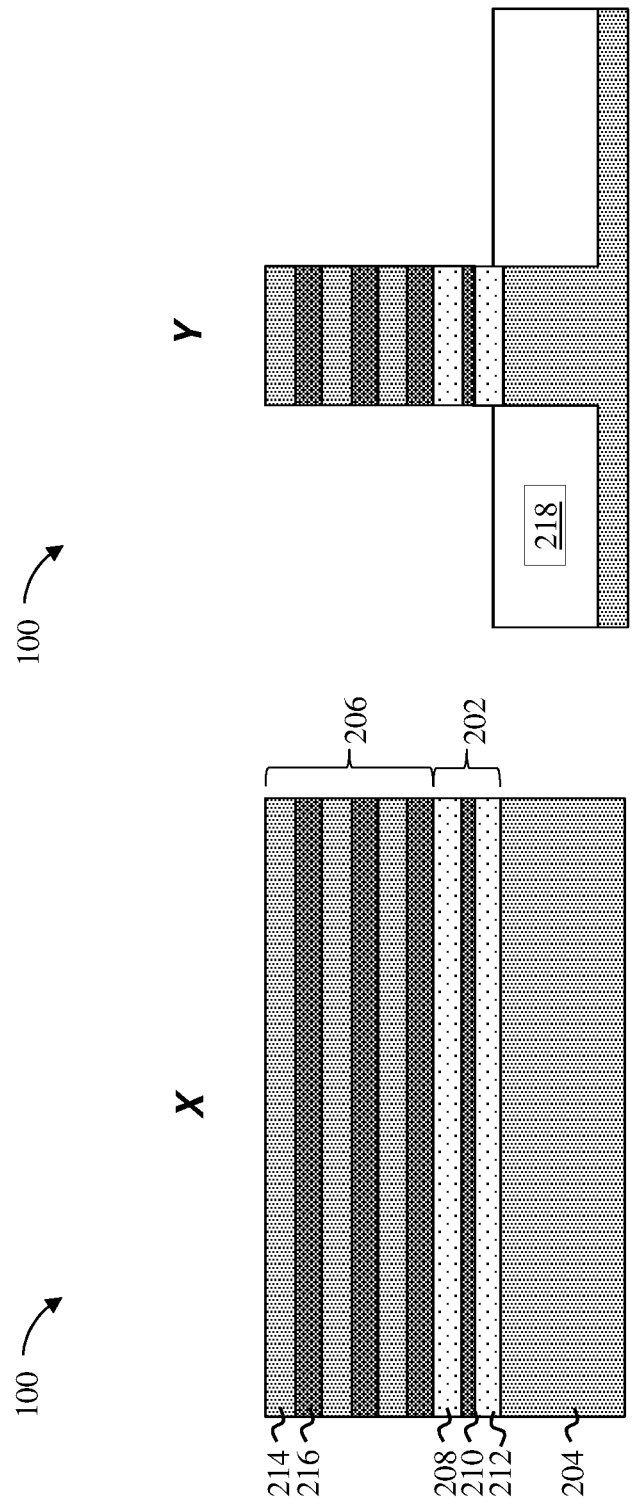

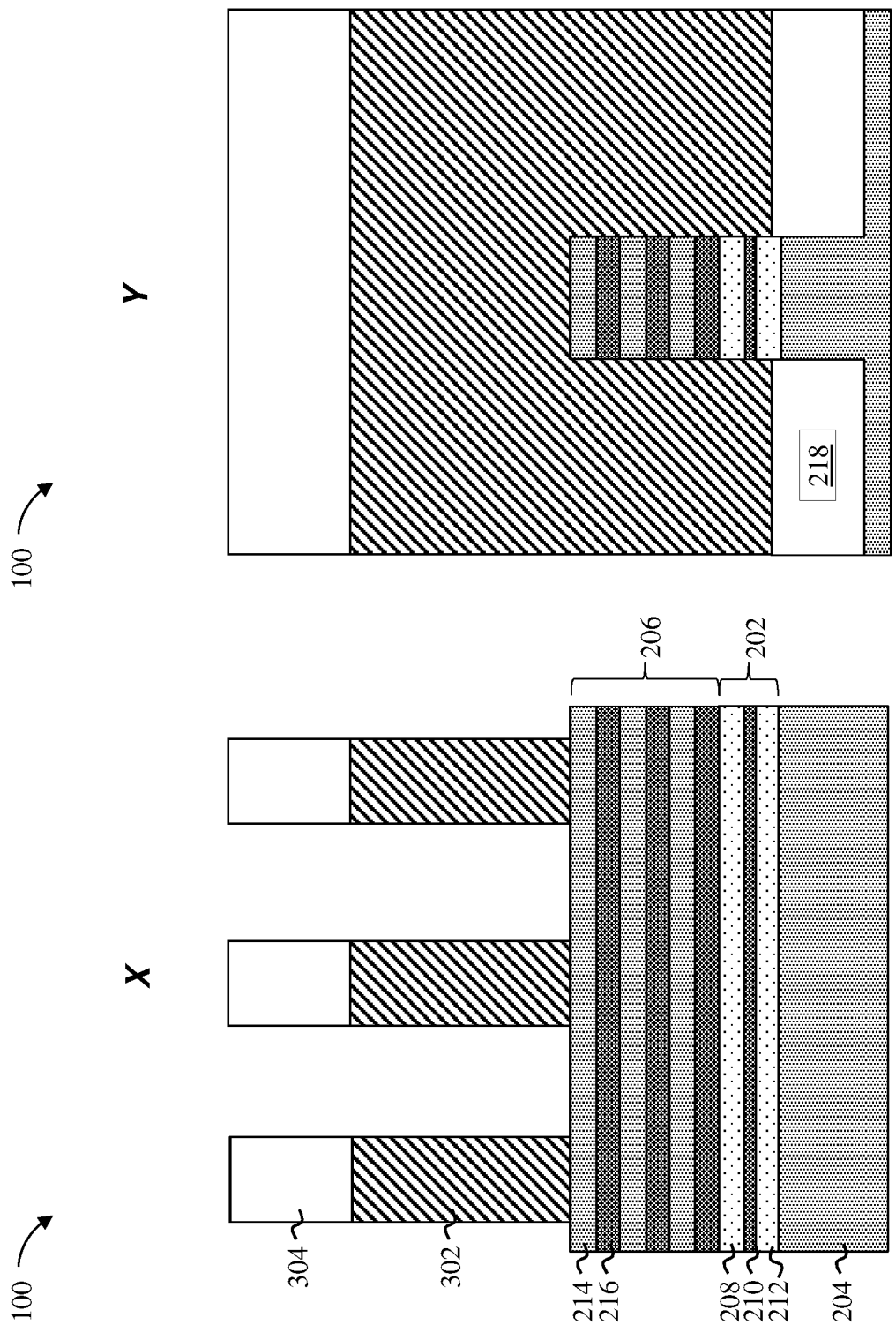

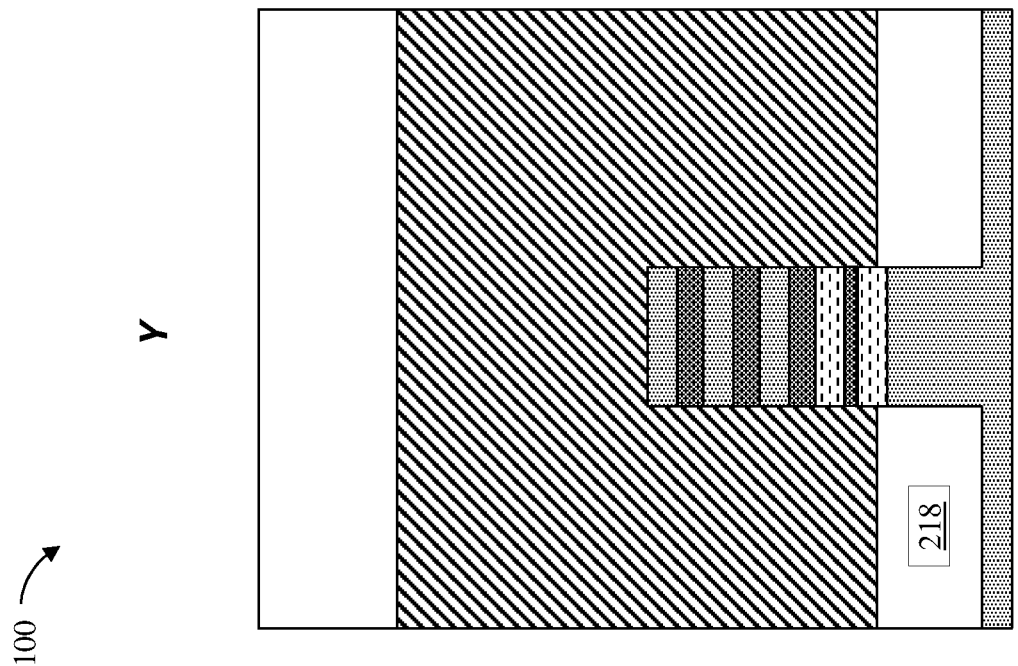
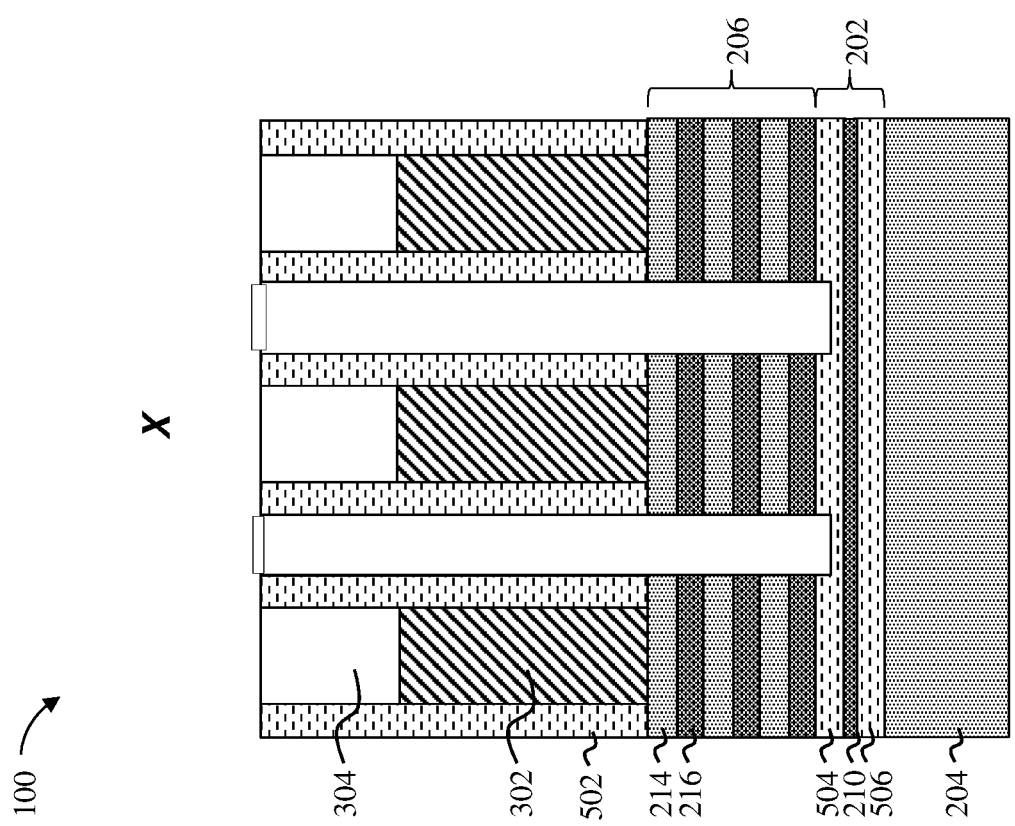

NANOSHEET BOTTOM ISOLATION AND SOURCE OR DRAIN EPITAXIAL GROWTH

BACKGROUND

The present invention generally relates to fabrication methods and resulting structures for semiconductor devices, and more specifically, to an improved process for providing a nanosheet bottom isolation and source or drain (S/D) epitaxial growth.

Known metal oxide semiconductor field effect transistor (MOSFET) fabrication techniques include process flows for constructing planar field effect transistors (FETs). A planar FET includes a substrate (also referred to as a silicon slab), a gate formed over the substrate, source and drain regions formed on opposite ends of the gate, and a channel region near the surface of the substrate under the gate. The channel region electrically connects the source region to the drain region while the gate controls the current in the channel. The gate voltage controls whether the path from drain to source is an open circuit ("off") or a resistive path ("on").

In recent years, research has been devoted to the development of nonplanar transistor architectures. For example, nanosheet FETs provide increased device density and some increased performance over lateral devices. In nanosheet FETs, in contrast to conventional FETs, the gate stack wraps around the full perimeter of each nanosheet, enabling fuller depletion in the channel region, and reducing short-channel effects due to steeper subthreshold swing (SS) and smaller drain induced barrier lowering (DIBL). The wrap-around gate structures and source/drain contacts used in nanosheet devices also enable greater management of leakage current and parasitic capacitance in the active regions, even as drive currents increase.

SUMMARY

Embodiments of the invention are directed to a method that prevents punch-through of a bottom isolation layer and improves the quality of the source/drain epitaxial growth in a nanosheet semiconductor structure. A non-limiting example of the method includes forming a bottom isolation structure over a substrate. The bottom isolation structure includes a tri-layer stack in a first region of the substrate and a bi-layer stack in a second region of the substrate. A nanosheet stack is formed over the bottom isolation structure in the first region of the substrate. A gate is formed over a channel region of the nanosheet stack.

Embodiments of the invention are directed to a method that prevents punch-through of a bottom isolation layer and improves the quality of the source/drain epitaxial growth in a nanosheet semiconductor structure. A non-limiting example of the method includes forming a bottom isolation structure over a substrate. The bottom isolation structure includes a top sacrificial layer, a middle sacrificial layer, and a bottom top sacrificial layer. The top sacrificial layer and the bottom sacrificial layer include a first germanium content and the middle sacrificial layer includes a second germanium content. A nanosheet stack is formed over the bottom isolation structure. The method includes replacing the top sacrificial layer and the bottom sacrificial layer with dielectric material, exposing a surface of the middle sacrificial layer, and forming a source or drain (S/D) region over the middle sacrificial layer. The middle sacrificial layer is replaced with dielectric material.

Embodiments of the invention are directed to a semiconductor structure. A non-limiting example of the semiconductor device includes a bottom isolation structure over a substrate. The bottom isolation structure includes a tri-layer stack in a first region of the substrate and a bi-layer stack in a second region of the substrate. A nanosheet stack is positioned over the bottom isolation structure in the first region of the substrate. The structure includes a semiconductor buffer layer is on a surface of the bottom isolation structure in the second region of the substrate. The structure includes a source or drain (S/D) region on the semiconductor buffer layer.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 2A depicts a cross-sectional view of a semiconductor structure along the line X of FIG. 1 after a processing operation according to one or more embodiments of the invention;

FIG. 2B depicts a cross-sectional view of a semiconductor structure along the line Y of FIG. 1 after a processing operation according to one or more embodiments of the invention;

FIG. 3A depicts a cross-sectional view of a semiconductor structure along the line X of FIG. 1 after a processing operation according to one or more embodiments of the invention;

FIG. 3B depicts a cross-sectional view of a semiconductor structure along the line Y of FIG. 1 after a processing operation according to one or more embodiments of the invention;

FIG. 5A depicts a cross-sectional view of a semiconductor structure along the line X of FIG. 1 after a processing operation according to one or more embodiments of the invention;

FIG. 5B depicts a cross-sectional view of a semiconductor structure along the line Y of FIG. 1 after a processing operation according to one or more embodiments of the invention;

Figure 1:
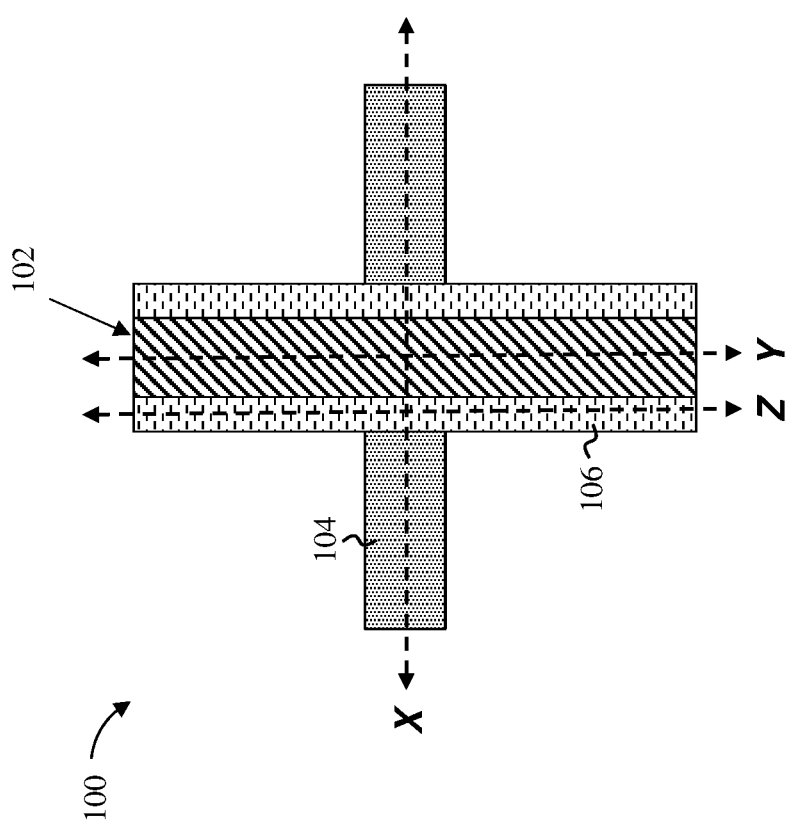
FIG. 1 depicts a top-down view of a semiconductor structure after a processing operation according to one or more embodiments of the invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, continued scaling of nanosheet FETs is currently limited due to the erosion of the bottom isolation layer during the conventional process flow (process of record, or POR). In particular, the bottom isolation layer is primarily lost during fin recess (about 3 nm loss), inner spacer formation (about 2.5 nm loss), and source/drain epitaxy pre-cleans (about 2.5 nm loss). As continued scaling has placed maximum thickness constraints on the bottom isolation, failure (or punch-through) of the bottom spacer is becoming increasingly problematic, resulting in yield loss and device failure (e.g., a source/drain epitaxy-to-substrate short). Another limiting factor for nanosheet scaling is the quality of the epitaxial growth from nanosheet sidewalls during the source/drain module. Epitaxial growth from the <111> nanosheet sidewalls is often defective and exhibits high growth variability, causing device failures.

Turning now to an overview of aspects of the present invention, one or more embodiments of the invention address the above-described shortcomings of the prior art by providing a new semiconductor structure and a method that prevents punch-through of the bottom isolation layer and improves the quality of the source/drain epitaxial growth. In aspects of the invention, the method includes forming a composite bottom isolation structure that is a bi-layer in the S/D region and a tri-layer inside the gate. This composite configuration prevents punch-through during the fin recess, inner spacer formation, and S/D epitaxy pre-cleans. Advantageously, a top layer of the bi-layer in the S/D region can include a sacrificial semiconductor material. In aspects of the invention, the method can include epitaxially growing a semiconductor buffer layer and a S/D region from the <100> surface of the sacrificial semiconductor material. The key benefits of <100> epitaxial growth are increases in epitaxy process control and epitaxy quality (uniformity).

Turning now to a more detailed description of aspects of the present invention, FIG. 1 depicts a top-down view of a semiconductor structure 100 after an initial set of fabrication operations have been applied as part of a method of fabricating a final semiconductor device according to one or more embodiments of the invention. In some embodiments of the invention, the final semiconductor device can include one or more gates 102 formed over one or more fins 104. In some embodiments of the invention, gate spacers 106 are on sidewalls of the one or more gates 102. The final semiconductor device can be a variety of types of MOSFETs, including, for example, n-type nanosheet field effect transistors (NS NFETs) and p-type field nanosheet field effect transistors (NS PFETs).

FIGS. 2A and 2B depict cross-sectional views of the semiconductor structure 100 taken along the lines X (across nanosheet) and Y (across gate) of FIG. 1 after an initial set of fabrication operations have been applied as part of a method of fabricating a final semiconductor device according to one or more embodiments of the invention. In some embodiments of the invention, a bottom isolation structure 202 is formed over a substrate 204. In some embodiments of the invention, a nanosheet stack 206 is formed over the bottom isolation structure 202.

The bottom isolation structure 202 can include a top sacrificial layer 208, a middle sacrificial layer 210, and a bottom sacrificial layer 212. The top sacrificial layer 208, middle sacrificial layer 210, and bottom sacrificial layer 212 can be made of any suitable material such as, for example, silicon or silicon germanium. In some embodiments of the invention, the top sacrificial layer 208 and the bottom sacrificial layer 212 are made of a first sacrificial material, while the middle sacrificial layer 210 is made of a second sacrificial material. In some embodiments of the invention, the first and second sacrificial materials are selected to ensure that the top sacrificial layer 208 and the bottom sacrificial layer 212 can be removed (e.g., etched) selective to the middle sacrificial layer 210.

In some embodiments of the invention, the top sacrificial layer 208 and the bottom sacrificial layer 212 are silicon germanium layers having a germanium concentration of about 60 percent (SiGe60). In some embodiments of the invention, the top sacrificial layer 208 and the bottom sacrificial layer 212 have a thickness of about 4 nm to about 15 nm, although other thicknesses are within the contemplated scope of the invention. In yet other embodiments, the top sacrificial layer 208 and the bottom sacrificial layer 212 have a thickness of about 10 nm.

In some embodiments of the invention, the middle sacrificial layer 210 is a silicon germanium layer having a germanium concentration of about 25 percent (SiGe25). SiGe60 can be removed selective to SiGe25 using, for example, an HCl dry etch at a suitable temperature and pressure. In this manner, the top sacrificial layer 208 and the bottom sacrificial layer 212 can be removed without removing the middle sacrificial layer 210. In some embodiments of the invention, the middle sacrificial layer 210 has a thickness of about 5 nm to about 8 nm, although other thicknesses are within the contemplated scope of the invention. The thickness of the middle sacrificial layer 210 is limited by the thickness of the sacrificial layers 216 in the nanosheet stack 206, as the middle sacrificial layer 210 must be thinner than the sacrificial layers 216 to ensure pinch-off of the bottom isolation structure 202 without completely filling the nanosheet cavities prior to gate formation (see FIG. 10A).

The substrate 204 can be made of any suitable substrate material, such as, for example, monocrystalline Si, silicon germanium (SiGe), III-V compound semiconductor, II-VI compound semiconductor, or semiconductor-on-insulator (SOI). Group III-V compound semiconductors, for example, include materials having at least one group III element and at least one group V element, such as one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys.

In some embodiments of the invention, the substrate 204 can include a buried oxide layer (not depicted). The buried oxide layer can be made of any suitable dielectric material, such as, for example, a silicon oxide. In some embodiments of the invention, the buried oxide layer is formed to a thickness of about 145 nm, although other thicknesses are within the contemplated scope of the invention.

In some embodiments of the invention, the nanosheet stack 206 can include one or more semiconductor layers 214 alternating with one or more sacrificial layers 216. In some embodiments of the invention, the semiconductor layers 214 and the sacrificial layers 216 are epitaxially grown layers. For ease of discussion reference is made to operations performed on and to a nanosheet stack 206 having three nanosheets (e.g., the semiconductor layers 214) alternating with three sacrificial layers 216. It is understood, however, that the nanosheet stack 206 can include any number of nanosheets alternating with a corresponding number of sacrificial layers. For example, the nanosheet stack 206 can include a single nanosheet, two nanosheets, five nanosheets, eight nanosheets, or any number of nanosheets, along with a corresponding number of sacrificial layers (i.e., as appropriate to form a nanosheet stack having a bottommost sacrificial layer under a bottommost nanosheet and a sacrificial layer between each pair of adjacent nanosheets).

The semiconductor layers 214 can be made of any suitable material such as, for example, monocrystalline silicon or silicon germanium. In some embodiments of the invention, the semiconductor layers 214 are nFET nanosheets. In some embodiments of the invention, the nFET nanosheets are silicon nFET nanosheets. In some embodiments of the invention, the semiconductor layers 214 have a thickness of about 4 nm to about 10 nm, for example 6 nm, although other thicknesses are within the contemplated scope of the invention. In some embodiments of the invention, the substrate 204 and the semiconductor layers 214 can be made of a same semiconductor material. In other embodiments of the invention, the substrate 204 can be made of a first semiconductor material, and the semiconductor layers 214 can be made of a second semiconductor material.

The sacrificial layers 216 can be silicon or silicon germanium layers depending on the material of the semiconductor layers 214. For example, in embodiments where the semiconductor layers 214 are silicon nanosheets, the sacrificial layers 216 can be silicon germanium layers. In some embodiments of the invention, the sacrificial layers 216 are silicon germanium layers having a germanium concentration of about 25 percent, although other germanium concentrations are within the contemplated scope of the invention. In some embodiments of the invention, the sacrificial layers 216 have a thickness of about 12 nm to about 15 nm, for example 10 nm, although other thicknesses are within the contemplated scope of the invention. In some embodiments of the invention, the sacrificial layers 216 are made of a same material as the middle sacrificial layer 210 in the bottom isolation structure 202.

As shown in FIG. 2B, a shallow trench isolation region 218 can be formed adjacent to the nanosheet stack 206 and the bottom isolation structure 202. In some embodiments of the invention, a trench is formed by removing portions of the nanosheet stack 206 and the bottom isolation structure 202 and then recessing an exposed surface of the substrate 204. The trench can then be filled with dielectric material, such as, a low-k dielectric, a nitride, silicon nitride, silicon oxide, SiON, SiC, SiOCN, or SiBCN. The shallow trench isolation region 218 provides electrical isolation between the nanosheet stack 206 and other adjacent devices (not shown) on the substrate 218.

FIGS. 3A and 3B depict cross-sectional views of the semiconductor structure 100 taken along the lines X and Y of FIG. 1 after a processing operation according to one or more embodiments of the invention. In some embodiments of the invention, one or more sacrificial gates 302 (sometimes referred to as dummy gates) are formed over the nanosheet stacks 206.

The sacrificial gates 302 can be made of any suitable material, such as, for example, amorphous silicon or polysilicon. Any known method for patterning a sacrificial gate can be used, such as, for example, a wet etch, a dry etch, or a combination of sequential wet and/or dry etches. In some embodiments of the invention, a hard mask 304 is formed on the sacrificial gates 302. In some embodiments of the invention, the sacrificial gates 302 are formed by patterning the hard mask 304 and using a wet or dry etch process to selectively remove portions of the sacrificial gates 302 which are not covered by the pattered hard mask 304. In some embodiments of the invention, a thin oxide layer (not shown) is formed between the nanosheet stack 206 and the sacrificial gates 302.

The hard mask 304 can be made of any suitable material, such as, for example, a silicon nitride. In some embodiments of the invention, a second hard mask (not depicted) is formed on the hard mask 304 to form a bilayer hard mask. In some embodiments, the second hard mask includes an oxide, such as, for example, silicon dioxide.

Figure 4A:
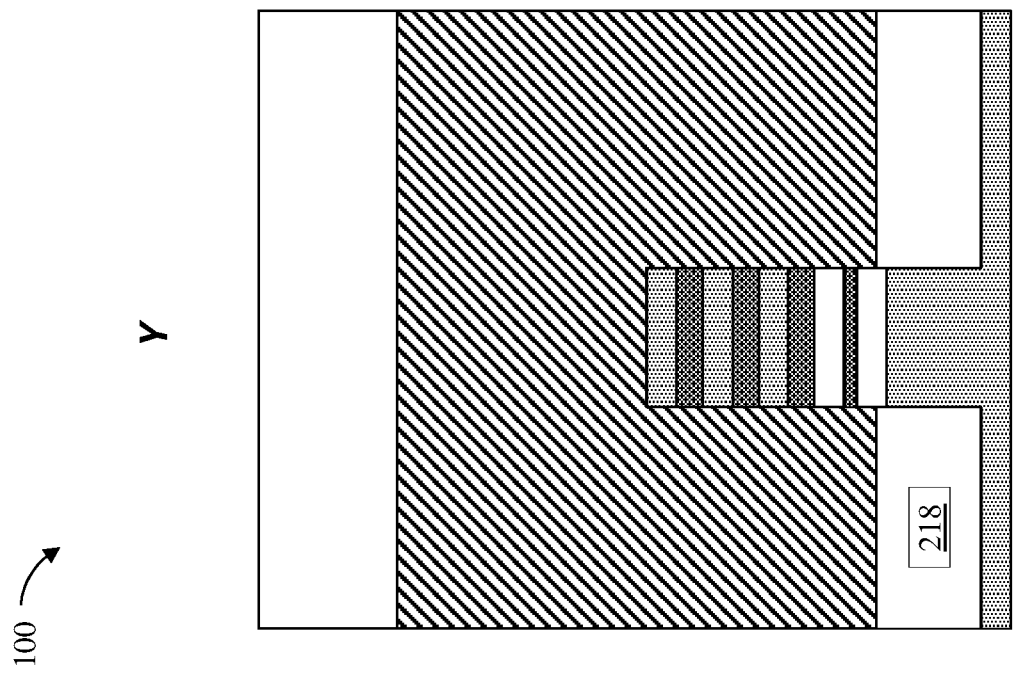
FIG. 4A depicts a cross-sectional view of a semiconductor structure along the line X of FIG. 1 after a processing operation according to one or more embodiments of the invention.
Figure 4B:
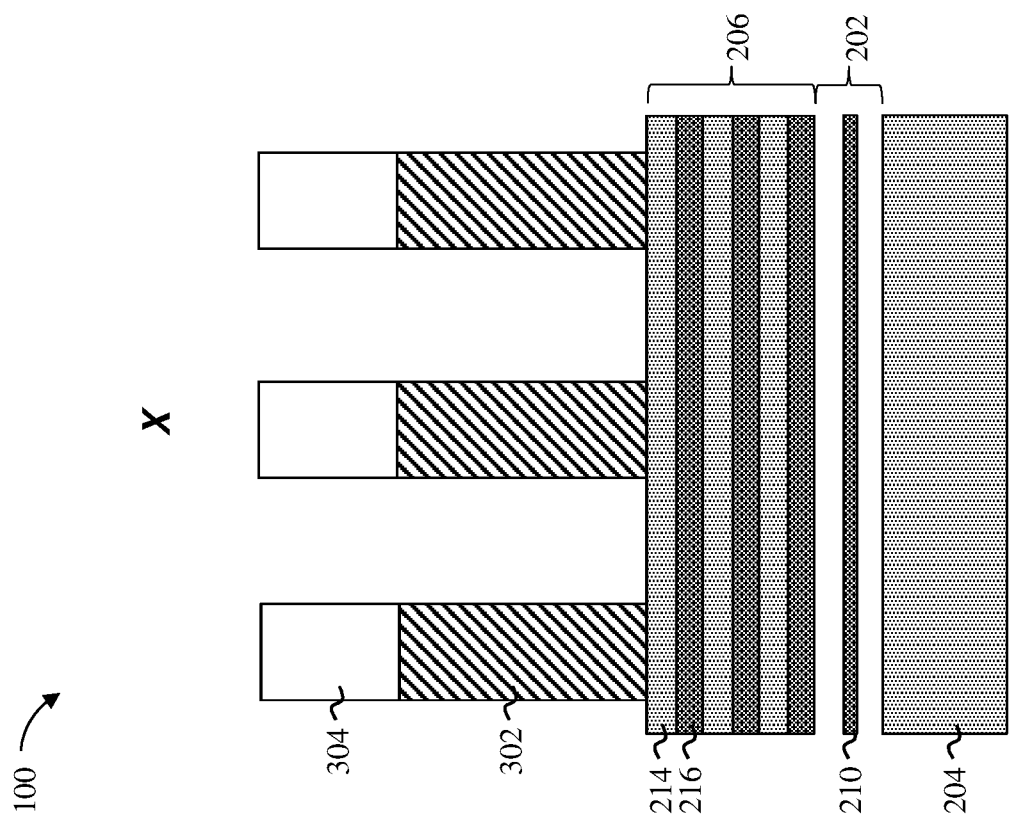
FIG. 4B depicts a cross-sectional view of a semiconductor structure along the line Y of FIG. 1 after a processing operation according to one or more embodiments of the invention.

FIGS. 4A and 4B depict cross-sectional views of the semiconductor structure 100 taken along the lines X and Y of FIG. 1 after a processing operation according to one or more embodiments of the invention. In some embodiments of the invention, the top sacrificial layer 208 and the bottom sacrificial layer 212 are removed to form a cavity in the bottom isolation structure 202. The top sacrificial layer 208 and the bottom sacrificial layer 212 can be removed using, for example, a wet etch, a dry etch, or a combination of wet and/or dry etches. In some embodiments of the invention, the top sacrificial layer 208 and the bottom sacrificial layer 212 are removed using a wet etch selective to the middle sacrificial layer 210. For example, SiGe60 can be removed selective to SiGe25.

FIGS. 5A and 5B depict cross-sectional views of the semiconductor structure 100 taken along the lines X and Y of FIG. 1 after a processing operation according to one or more embodiments of the invention. In some embodiments of the invention, spacers 502 (also known as sidewall spacers or gate spacers) are formed on sidewalls of the sacrificial gates 302.

In some embodiments of the invention, the spacers 502 are formed using a chemical vapor deposition (CVD), plasma-enhanced CVD (PECVD), ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), atomic layer deposition (ALD), physical vapor deposition (PVD), chemical solution deposition, molecular beam epitaxy (MBE), or other like process in combination with a wet or dry etch process. For example, spacer material can be conformally deposited over the semiconductor structure 100 and selectively removed using a RIE to form the spacers 502.

The spacers 502 can be made of any suitable material, such as, for example, a low-k dielectric, a nitride, silicon nitride, silicon oxide, SiON, SiC, SiOCN, or SiBCN. In some embodiments of the invention, the spacers 502 include silicon nitride. The spacers 502 can be formed to a thickness of about 5 to 40 nm, although other thicknesses are within the contemplated scope of the invention. As shown in FIG. 5A, during this spacer material deposition process, a top isolation layer 504 and a bottom isolation layer 506 are formed by filling the cavity of the bottom isolation structure 202.

As further shown in FIG. 5A, portions of the nano sheet stack 206 can be removed (sometimes referred to as a fin recess) to expose a surface of the top isolation layer 504. The nanosheet stack 206 can be patterned using, for example, a wet etch, a dry etch, or a combination of wet and/or dry etches. In some embodiments of the invention, the nanosheet stack 206 is patterned using a RIE. In some embodiments of the invention, the nanosheet stack 206 is patterned selective to the spacers 502. As discussed previously herein and illustrated in FIG. 5A, this fin recess can damage the top spacer 504. The result is a partial loss of some of the top spacer 504 thickness. In other words, the top spacer 504 can be inadvertently recessed.

Figure 6:
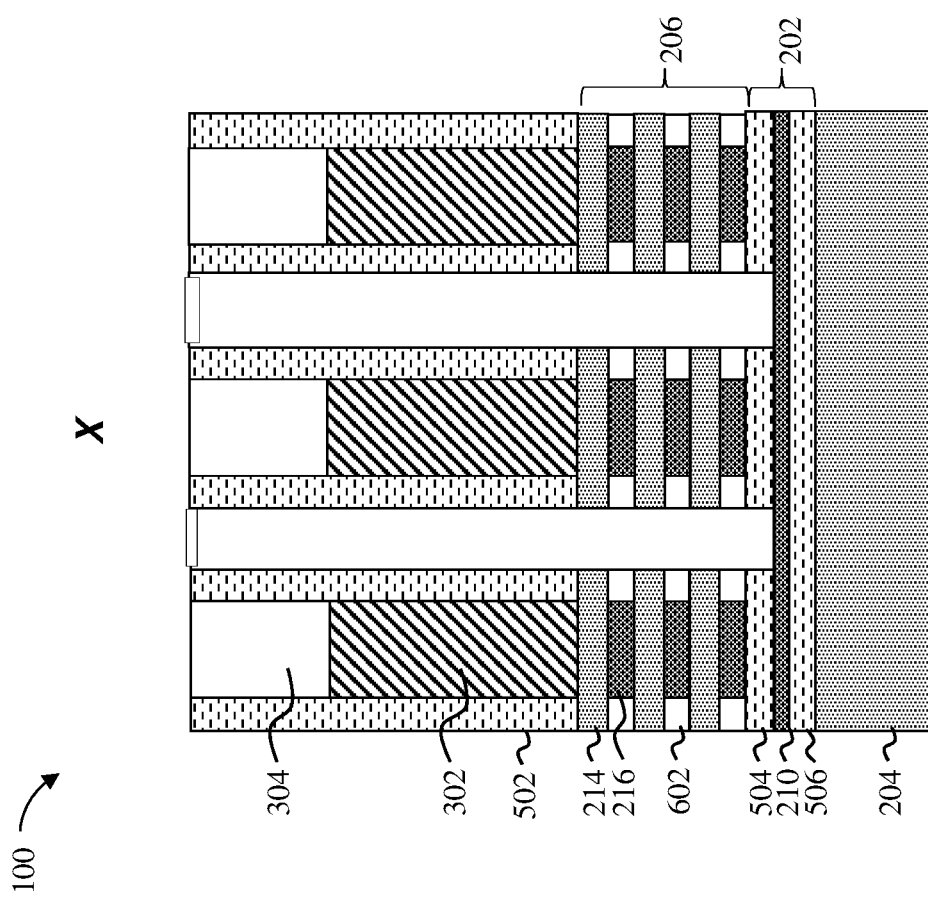
FIG. 6 depicts a cross-sectional view of a semiconductor structure along the line X of FIG. 1 after a processing operation according to one or more embodiments of the invention.

FIG. 6 depicts a cross-sectional view of the semiconductor structure 100 taken along the line X of FIG. 1 after a processing operation according to one or more embodiments of the invention. In some embodiments of the invention, sidewalls of the sacrificial layers 216 are recessed to form cavities in the nanosheet stack 206. In some embodiments of the invention, inner spacers 602 are formed on recessed sidewalls of the sacrificial layers 216 by filling these cavities with dielectric material. In some embodiments of the invention, portions of the inner spacers 602 that extend beyond sidewalls of the nanosheet stack 206 are removed, using, for example, a RIE. In this manner, sidewalls of the inner spacers 602 are coplanar to sidewalls of the semiconductor layers 214.

In some embodiments of the invention, the inner spacers 602 are formed using a CVD, PECVD, ALD, PVD, chemical solution deposition, or other like processes in combination with a wet or dry etch process. The inner spacers 602 can be made of any suitable material, such as, for example, a low-k dielectric, a nitride, silicon nitride, silicon dioxide, SiON, SiC, SiOCN, or SiBCN.

As discussed previously herein and illustrated in FIG. 6, inner spacer formation can damage the top spacer 504. The result is an additional partial loss of some of the top spacer 504 thickness (over that already experienced due to the fin recess). In other words, the top spacer 504 can be inadvertently further recessed.

In some embodiments of the invention, an epitaxy pre-clean process can be used to prepare the semiconductor structure 100 for source/drain formation. As discussed previously herein, this epi pre-clean can damage the top spacer 504. The result is an additional loss of the top spacer 504 thickness (over that already experienced due to the fin recess and inner spacer formation). In some embodiments of the invention, the culmination of the fin recess, inner spacer formation, and epi pre-clean is a complete recess of the top spacer 504, resulting in exposure of a top surface of the middle sacrificial layer 210. In some embodiments of the invention, any remaining portion of the top spacer 504 in the source/drain region (see FIG. 7) can be removed using, for example, a wet or dry etch.

Figure 7:
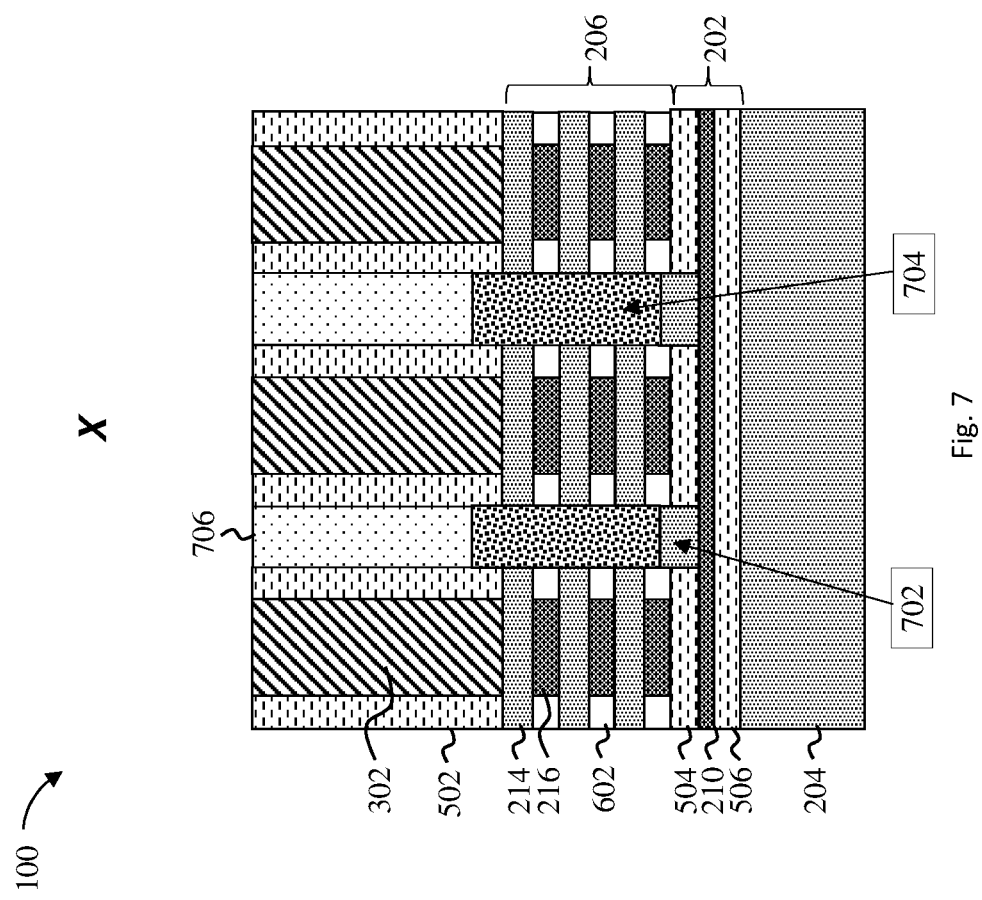
FIG. 7 depicts a cross-sectional view of a semiconductor structure along the line X of FIG. 1 after a processing operation according to one or more embodiments of the invention.

FIG. 7 depicts a cross-sectional view of the semiconductor structure 100 taken along the line X of FIG. 1 after a processing operation according to one or more embodiments of the invention. In some embodiments of the invention, a semiconductor buffer layer 702 is formed on the exposed surface of the middle sacrificial layer 210. The semiconductor buffer layer 702 can be formed, for example, by epitaxial growth. The semiconductor buffer layer 702 can be formed to a thickness of 2 nm to 10 nm, although other thicknesses are within the contemplated scope of the invention. The semiconductor buffer layer 702 can be made of any suitable material, such as, for example, silicon or silicon germanium. In some embodiments of the invention, the semiconductor buffer layer 702 is a silicon layer epitaxially grown from the exposed surface of the middle sacrificial layer 210.

In some embodiments of the invention, source and drain regions 704 are formed on the semiconductor buffer layer 702. Advantageously, the source and drain regions 704 can be formed by epitaxial growth from the <100> surface (i.e., the top surface) of the semiconductor buffer layer 702 (in contrast to conventional processes, whereby the source or drain is epitaxially grown from the <111> sidewall of the nanosheets). While some growth from the <111> sidewalls of the semiconductor layers 214 is possible, epitaxial growth from a <100> surface is much faster and will dominate the overall epitaxial growth process. In some embodiments of the invention, the source and drain regions 704 are formed to a thickness (height) of 10 nm or more, for example 40 nm to 70 nm, although other thicknesses are within the contemplated scope of the invention.

The source and drain regions 704 can be epitaxially grown using, for example, vapor-phase epitaxy (VPE), molecular beam epitaxy (MBE), liquid-phase epitaxy (LPE), or other suitable processes. The source and drain regions 704 can be semiconductor materials epitaxially grown from gaseous or liquid precursors.

In some embodiments of the invention, the gas source for the epitaxial deposition of semiconductor material includes a silicon containing gas source, a germanium containing gas source, or a combination thereof. For example, a Si layer can be epitaxially deposited (or grown) from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. A germanium layer can be epitaxially deposited from a germanium gas source that is selected from the group consisting of germane, digermane, halogermane, dichlorogermane, trichlorogermane, tetrachlorogermane and combinations thereof. A silicon germanium alloy layer can be epitaxially formed utilizing a combination of such gas sources. Carrier gases like hydrogen, nitrogen, helium and argon can be used. In some embodiments of the invention, the epitaxial semiconductor materials include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

Epitaxially grown silicon and silicon germanium can be doped by adding n-type dopants (e.g., P or As) or p-type dopants (e.g., Ga, B, $BF_2$, or Al). In some embodiments of the invention, the source and drain regions 704 can be epitaxially formed and doped by a variety of methods, such as, for example, in-situ doped epitaxy (doped during deposition), doped following the epitaxy, or by implantation and plasma doping. The dopant concentration in the doped regions can range from $1\times10^{19}$ cm$^{-3}$ to $2\times10^{21}$ cm$^{-3}$, or between $1\times10^{20}$ cm$^{-3}$ and $1\times10^{21}$ cm$^{-3}$.

In some embodiments of the invention, the source and drain regions 704 are made of silicon or silicon germanium. In some embodiments of the invention, the source and drain regions 704 are made of silicon germanium having a germanium concentration of about 10 to about 65 percent, for example, 50 percent, although other germanium concentrations are within the contemplated scope of the invention.

As further depicted in FIG. 7, an interlayer dielectric 706 can be formed over the semiconductor structure 100. The interlayer dielectric 706 can be made of any suitable dielectric material, such as, for example, porous silicates, carbon doped oxides, silicon dioxides, silicon nitrides, silicon oxynitrides, or other dielectric materials. Any known manner of forming the interlayer dielectric 706 can be utilized, such as, for example, CVD, PECVD, ALD, flowable CVD, spin-on dielectrics, or PVD. In some embodiments of the invention, the interlayer dielectric 706 and the shallow trench isolation region 218 are made of the same dielectric material, and together define a single continuous dielectric region.

In some embodiments of the invention, the semiconductor structure 100 is planarized to a surface of the sacrificial gates 302. The semiconductor structure 100 can be planarized using, for example, chemical-mechanical planarization (CMP). In some embodiments of the invention, the hard mask 304 can be removed during the planarization process.

Figure 8:
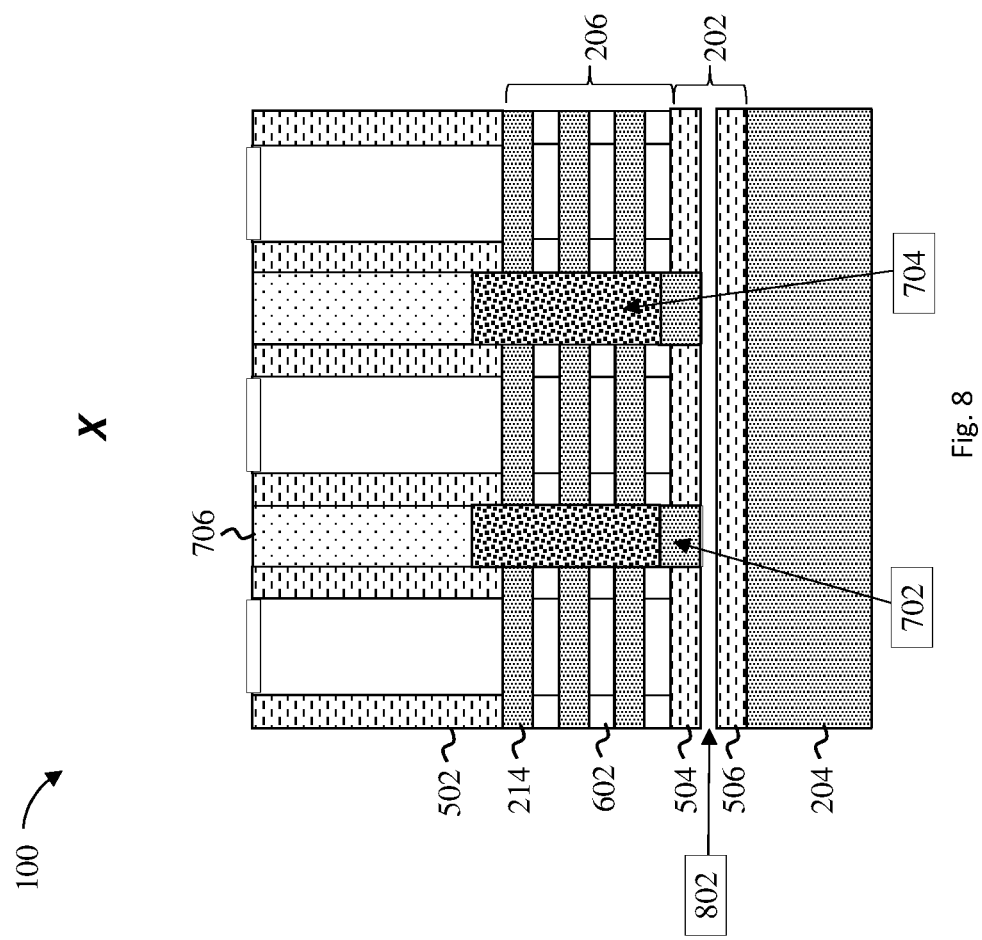
FIG. 8 depicts a cross-sectional view of a semiconductor structure along the line X of FIG. 1 after a processing operation according to one or more embodiments of the invention.

FIG. 8 depicts a cross-sectional view of the semiconductor structure 100 taken along the line X of FIG. 1 after a processing operation according to one or more embodiments of the invention. In some embodiments of the invention, the sacrificial gates 302, the sacrificial layers 216, and the middle sacrificial layer 210 are removed. Any known method for removing a sacrificial gate can be used, such as, for example, a wet etch, a dry etch, or a combination of sequential wet and/or dry etches. In some embodiments of the invention, the sacrificial gates 302 are removed using an ashing process.

The sacrificial layers 216 and the middle sacrificial layer 210 can be removed using any suitable process, such as a wet etch, a dry etch, or a combination of sequential wet and/or dry etches. In some embodiments of the invention, the sacrificial layers 216 and the middle sacrificial layer 210 are a same material (e.g., SiGe25) and are removed during a same etch process (e.g., by exposure to a common etchant). In some embodiments of the invention, the sacrificial layers 216 and the middle sacrificial layer 210 are removed selective to the semiconductor layers 214. For example, SiGe25 can be removed selective to silicon using an HCl dry etch. In some embodiments of the invention, removing the middle sacrificial layer 210 forms a cavity 802.

Figure 9:
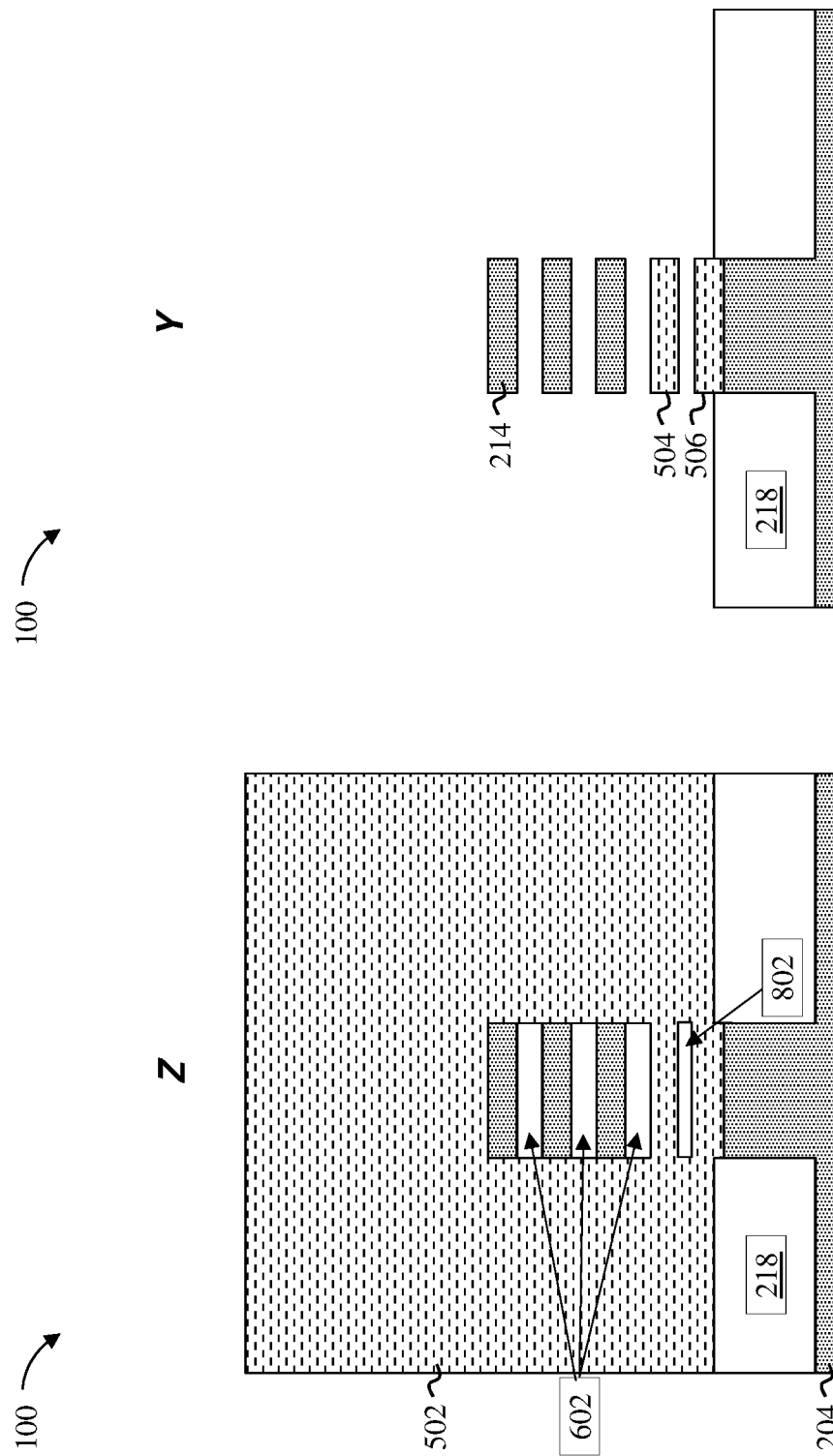
FIG. 9A depicts a cross-sectional view of a semiconductor structure along the line Z of FIG. 1 after a processing operation according to one or more embodiments of the invention.
FIG. 9B depicts a cross-sectional view of a semiconductor structure along the line Y of FIG. 1 after a processing operation according to one or more embodiments of the invention.

FIGS. 9A and 9B depict cross-sectional views of the semiconductor structure 100 taken along the lines Z and Y of FIG. 1 after the processing operation discussed with respect to FIG. 8. As best shown in FIG. 9A, the semiconductor structure 100 is anchored by the spacers 502 after removing the middle sacrificial layer 210 and forming the cavity 802.

Figure 10:
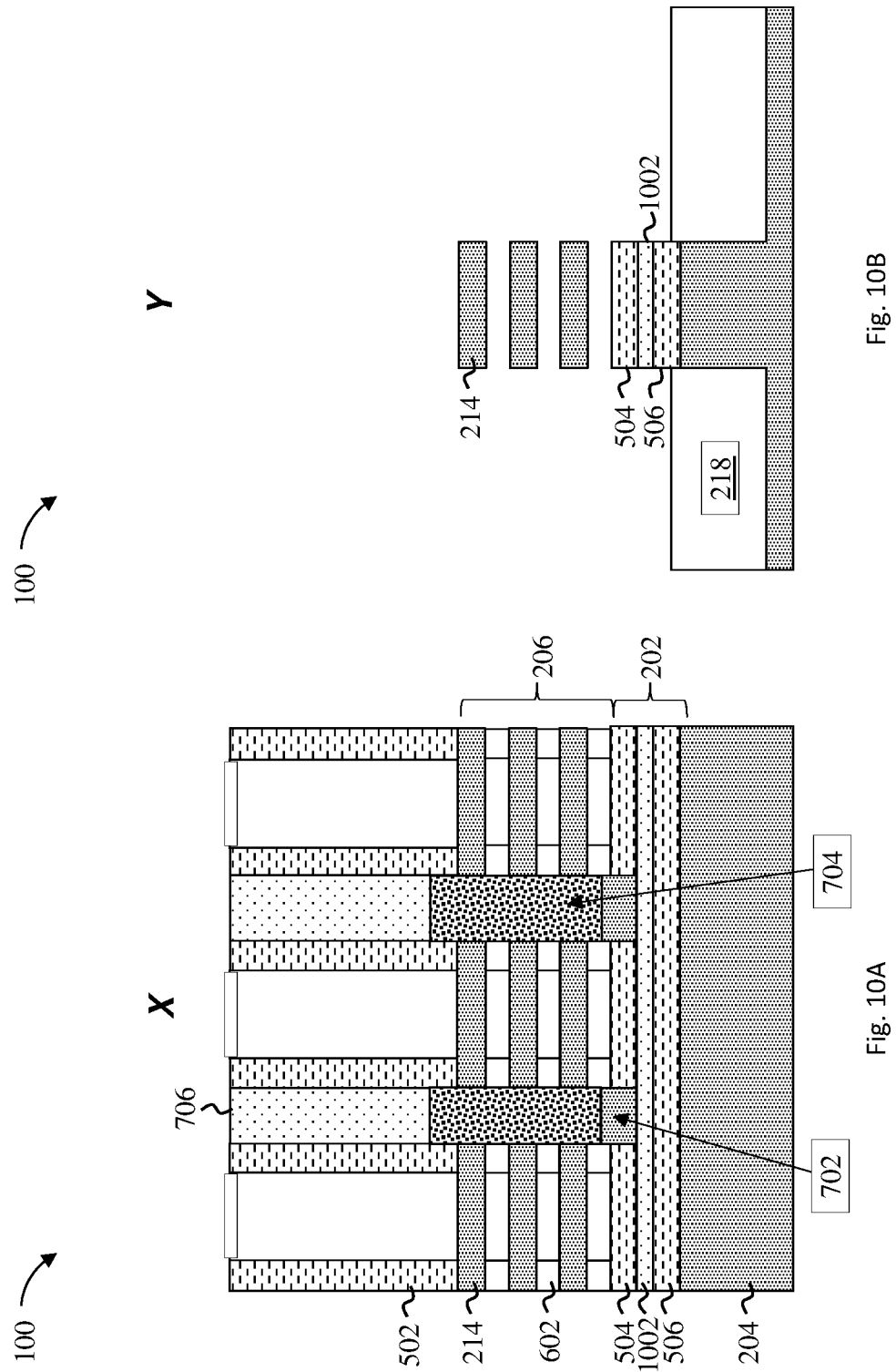
FIG. 10A depicts a cross-sectional view of a semiconductor structure along the line X of FIG. 1 after a processing operation according to one or more embodiments of the invention.
FIG. 10B depicts a cross-sectional view of a semiconductor structure along the line Y of FIG. 1 after a processing operation according to one or more embodiments of the invention.

FIGS. 10A and 10B depict cross-sectional views of the semiconductor structure 100 taken along the lines X and Y of FIG. 1 after a processing operation according to one or more embodiments of the invention. In some embodiments of the invention, a middle isolation layer 1002 is formed between the top isolation layer 504 and the bottom isolation layer 506 of the bottom isolation structure 202.

In some embodiments of the invention, the middle isolation layer 1002 is formed by filling the cavity 802 with dielectric material. The dielectric material can be deposited using any suitable process, such as, CVD, PECVD, ALD, PVD, chemical solution deposition, or other like process. In some embodiments of the invention, the middle isolation layer 1002 is formed by an ALD deposition followed by a high-k pre-clean. The middle isolation layer 1002 can be made of any suitable material, such as, for example, a low-k dielectric, a nitride, silicon nitride, silicon dioxide, SiON, SiC, SiOCN, or SiBCN. In some embodiments of the invention, the dielectric material is silicon dioxide deposited on exposed surfaces of the cavity 802 using ALD until the cavity 802 is pinched-off.

Figure 11:
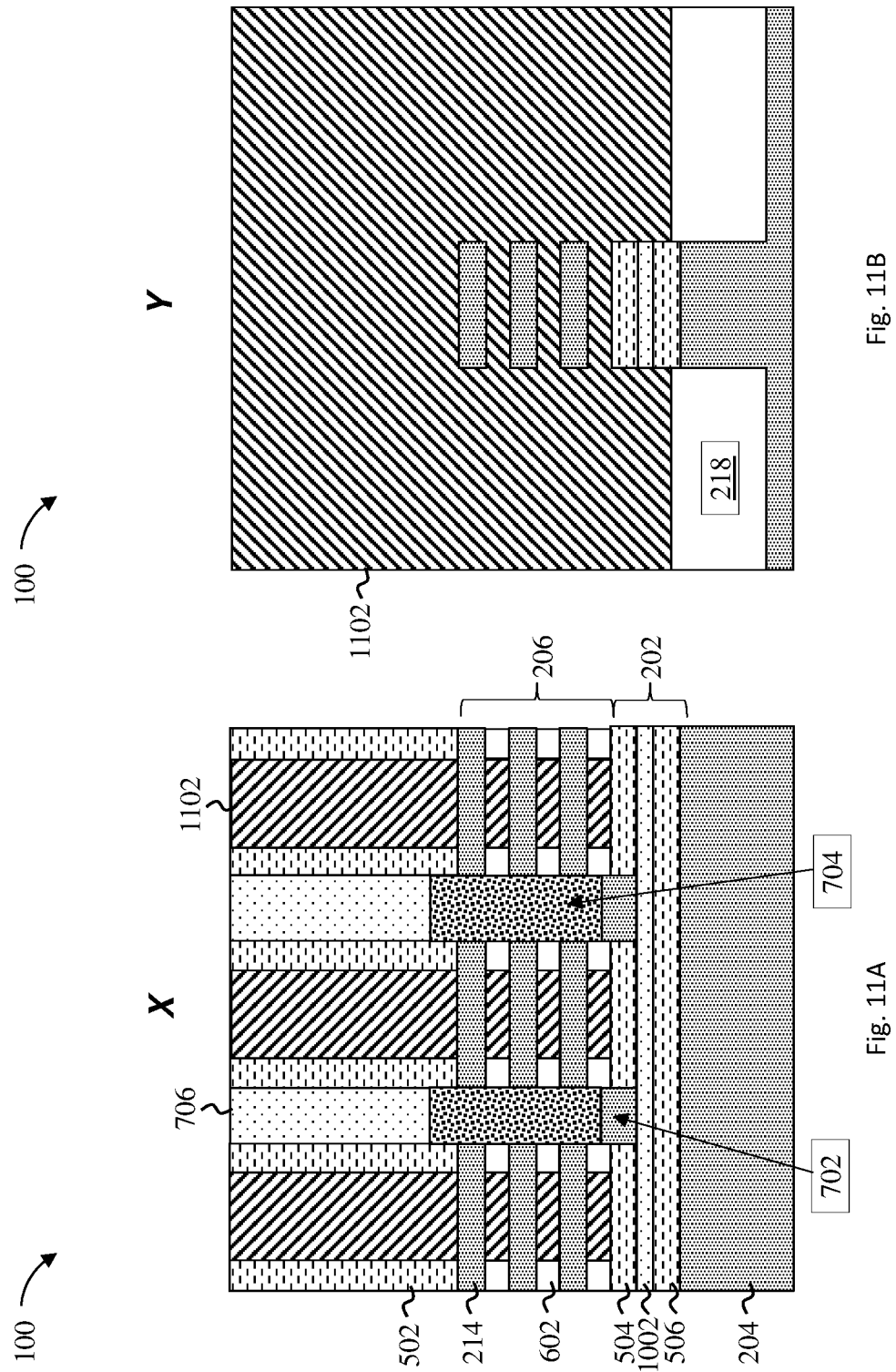
FIG. 11A depicts a cross-sectional view of a semiconductor structure along the line X of FIG. 1 after a processing operation according to one or more embodiments of the invention.
FIG. 11B depicts a cross-sectional view of a semiconductor structure along the line Y of FIG. 1 after a processing operation according to one or more embodiments of the invention.

FIGS. 11A and 11B depict cross-sectional views of the semiconductor structure 100 taken along the lines X and Y of FIG. 1 after a processing operation according to one or more embodiments of the invention. In some embodiments of the invention, one or more gate(s) 1102 are formed over the nanosheet stack 206.

As best shown in FIG. 11B, the gates 1102 can be high-k metal gates (HKMGs) formed over a channel region (the semiconductor layers 214, sometimes referred to as nanosheets) of the nanosheet stack 206 using, for example, known replacement metal gate (RMG) processes, or so-called gate-first processes. The gates 1102 can include a high-k dielectric material(s) (not shown) and a work function metal stack (not shown). In some embodiments of the invention, the gates 1102 include a main body formed from bulk conductive gate material(s).

In some embodiments of the invention, the gate dielectric is a high-k dielectric film formed on a surface of the nanosheets (the exposed portions of the semiconductor layers 214). The high-k dielectric film can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments of the invention, the high-k dielectric film can have a thickness of about 0.5 nm to about 4 nm. In some embodiments of the invention, the high-k dielectric film includes hafnium oxide and has a thickness of about 1 nm, although other thicknesses are within the contemplated scope of the invention.

In some embodiments of the invention, the gates 1102 include one or more work function layers (sometimes referred to as a work function metal stack) formed between the high-k dielectric film and a bulk gate material. In some embodiments of the invention, the gates 1102 include one or more work function layers, but do not include a bulk gate material.

If present, the work function layers can be made of, for example, aluminum, lanthanum oxide, magnesium oxide, strontium titanate, strontium oxide, titanium nitride, tantalum nitride, hafnium nitride, tungsten nitride, molybdenum nitride, niobium nitride, hafnium silicon nitride, titanium aluminum nitride, tantalum silicon nitride, titanium aluminum carbide, tantalum carbide, and combinations thereof. The work function layer can serve to modify the work function of the gates 1102 and enables tuning of the device threshold voltage. The work function layers can be formed to a thickness of about 0.5 to 6 nm, although other thicknesses are within the contemplated scope of the invention. In some embodiments of the invention, each of the work function layers can be formed to a different thickness. In some embodiments of the invention, the work function layers include a TiN/TiC/TiCAl stack.

In some embodiments, the gates 1102 include a main body formed from bulk conductive gate material(s) deposited over the work function layers. The bulk gate material can include any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), conductive carbon, graphene, or any suitable combination of these materials. The conductive gate material can further include dopants that are incorporated during or after deposition.

As best shown in FIG. 11A, the bottom isolation structure 202 is a bi-layer structure (the middle isolation layer 1002 and the bottom isolation layer 506) below the semiconductor buffer layer 702 and the source and drain regions 704.

As best shown in FIG. 11B, the bottom isolation structure 202 is a tri-layer structure (the top isolation layer 504, the middle isolation layer 1002, and the bottom isolation layer 506) below the gates 1102.

Figure 12:
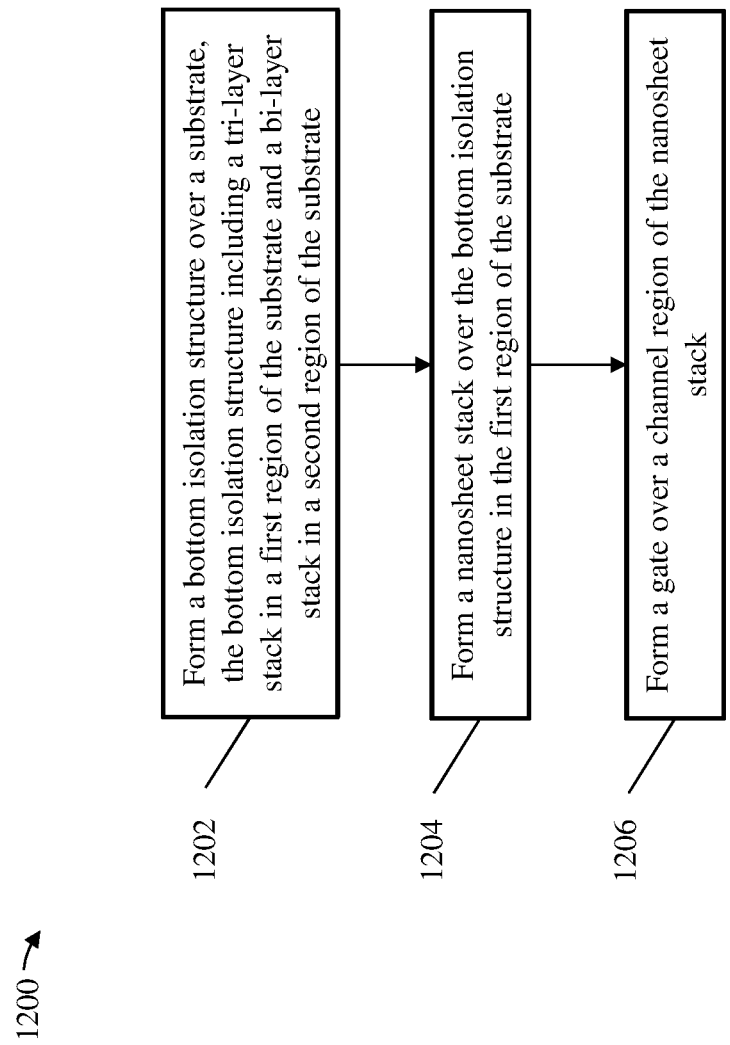
FIG. 12 depicts a flow diagram illustrating a method according to one or more embodiments of the invention.

FIG. 12 depicts a flow diagram 1200 illustrating a method for forming a semiconductor device according to one or more embodiments of the invention. As shown at block 1202, a bottom isolation structure is formed over a substrate. The bottom isolation structure can include a tri-layer stack in a first region of the substrate and a bi-layer stack in a second region of the substrate, in a similar manner as the bottom isolation structure 202 discussed previously herein with respect to FIG. 11A. In some embodiments of the invention, the tri-layer stack of the bottom isolation structure includes a nitride-oxide-nitride stack (e.g., SiN/SiO$_2$/SiN). In some embodiments of the invention, the first region of the substrate is under the gate and the second region of the substrate is under the S/D region.

In some embodiments of the invention, forming the bottom isolation structure includes forming a top sacrificial layer, a middle sacrificial layer, and a bottom sacrificial layer over the substrate. In some embodiments of the invention, the top sacrificial layer and the bottom sacrificial layer include silicon germanium having a first germanium concentration and the middle sacrificial layer includes silicon germanium having a second germanium concentration. In some embodiments of the invention, the first germanium concentration is about 60 percent and the second germanium concentration is about 25 percent.

In some embodiments of the invention, forming the bottom isolation structure includes removing the top sacrificial layer and the bottom sacrificial layer selective to the middle sacrificial layer to form a cavity and filling the cavity with dielectric material to form a top isolation layer and a bottom isolation layer. In some embodiments of the invention, forming the bottom isolation structure includes removing the middle sacrificial layer selective to the top isolation layer and bottom isolation layer to form a cavity, and filling the cavity with dielectric material to form a middle isolation layer.

At block 1204, a nanosheet stack is formed over the bottom isolation structure in the first region of the substrate. The nanosheet stack can be formed in a similar manner as the nanosheet stack 206 discussed previously herein with respect to FIG. 11A.

At block 1206, a gate is formed over a channel region of the nanosheet stack. The gate can be formed in a similar manner as the gate 1102 discussed previously herein with respect to FIG. 11A.

The method can further include forming a semiconductor buffer layer on a surface of the bottom isolation structure in the second region of the substrate. In some embodiments of the invention, forming the semiconductor buffer layer includes epitaxially growing the semiconductor buffer layer from a middle layer of the bottom isolation structure. In some embodiments of the invention, a source or drain (S/D) region is formed on the semiconductor buffer layer. In some embodiments of the invention, forming the S/D region includes epitaxially growing the S/D region from a <100> surface of the semiconductor buffer layer.

Figure 13:
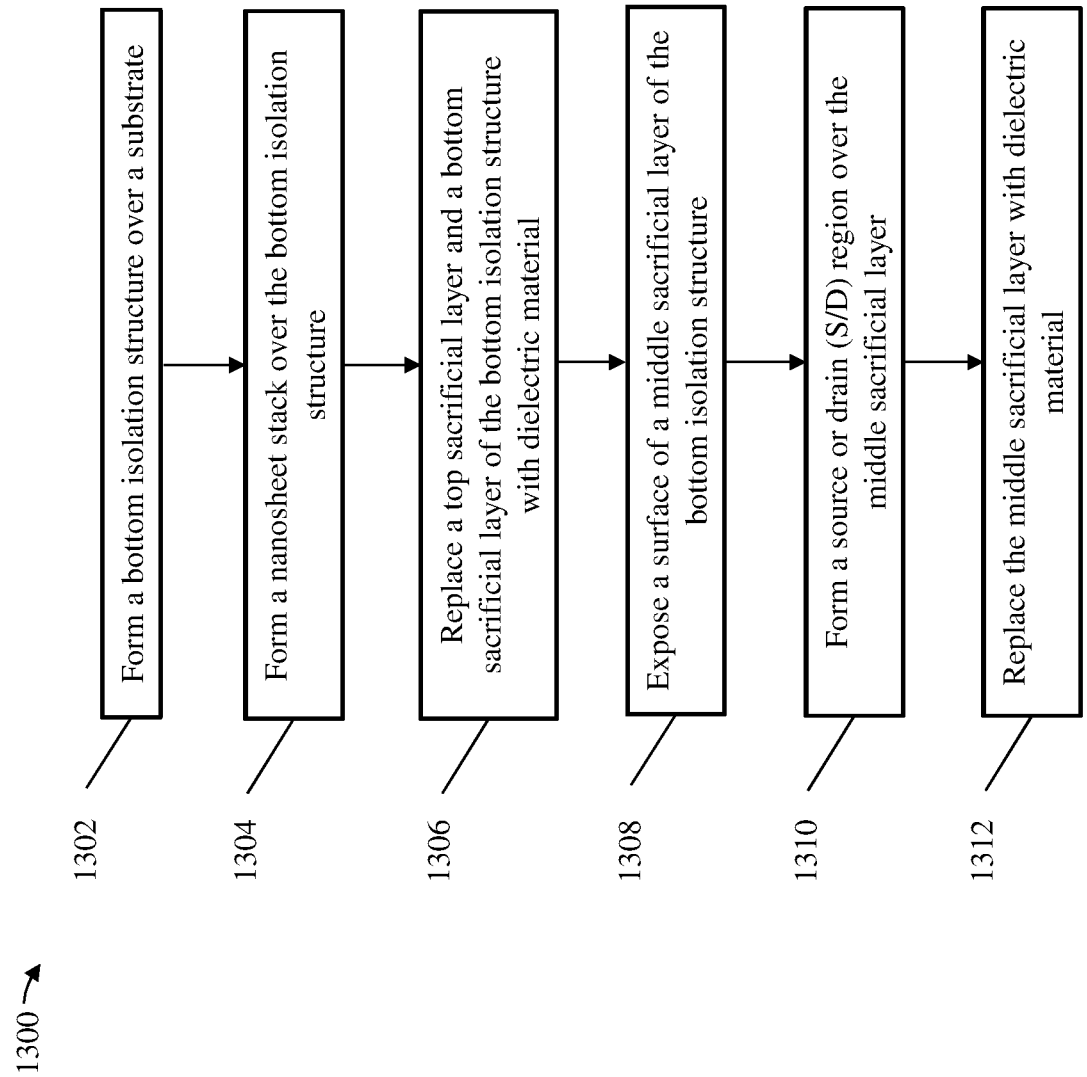
FIG. 13 depicts a flow diagram illustrating a method according to one or more embodiments of the invention.

FIG. 13 depicts a flow diagram 1300 illustrating a method for forming a semiconductor device according to one or more embodiments of the invention. As shown at block 1302, a bottom isolation structure is formed over a substrate. The bottom isolation structure can include a top sacrificial layer, a middle sacrificial layer, and a bottom top sacrificial layer. In some embodiments of the invention, the top sacrificial layer and the bottom sacrificial layer include a first germanium content and the middle sacrificial layer includes a second germanium content. In some embodiments of the invention, the tri-layer stack of the bottom isolation structure includes a nitride-oxide-nitride stack (e.g., $SiN/SiO_2/SiN$).

At block 1304, a nanosheet stack is formed over the bottom isolation structure in the first region of the substrate. The nanosheet stack can be formed in a similar manner as the nanosheet stack 206 discussed previously herein with respect to FIG. 11A.

At block 1306, the top sacrificial layer and the bottom sacrificial layer are replaced with dielectric material. In some embodiments of the invention, replacing the top sacrificial layer and the bottom sacrificial layer includes removing the top sacrificial layer and the bottom sacrificial layer to define a first cavity and forming a top isolation layer and a bottom isolation layer in the cavity. The top isolation layer and the bottom isolation layer can include the dielectric material.

At block 1308, a surface of the middle sacrificial layer is exposed. At block 1310, a S/D region is formed over the middle sacrificial layer. At block 1312, the middle sacrificial layer is replaced with dielectric material. In some embodiments of the invention, replacing the middle sacrificial layer includes removing the middle sacrificial layer to define a second cavity and forming a middle isolation layer in the second cavity. The middle isolation layer can include the dielectric material.

The method can include forming a semiconductor buffer layer on the exposed surface of the middle sacrificial layer. The semiconductor buffer layer can be positioned between the middle sacrificial layer and the S/D region. In some embodiments of the invention, forming the S/D region includes epitaxially growing the S/D region from a <100> surface of the semiconductor buffer layer.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal,"

"top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ± 8% or 5%, or 2% of a given value.

The phrase "selective to," such as, for example, "a first element selective to a second element," means that the first element can be etched and the second element can act as an etch stop.

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a <100> orientated crystalline surface can take on a <100> orientation. In some embodiments of the invention of the invention, epitaxial growth and/or deposition processes can be selective to forming on semiconductor surface, and may or may not deposit material on other exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
   forming a bottom isolation structure over a substrate, the bottom isolation structure comprising a tri-layer stack in a first region of the substrate and a bi-layer stack in a second region of the substrate;
   forming a nanosheet stack over the bottom isolation structure in the first region of the substrate; and
   forming a gate over a channel region of the nanosheet stack.

2. The method of claim 1 further comprising forming a semiconductor buffer layer on a surface of the bottom isolation structure in the second region of the substrate.

3. The method of claim 2, wherein forming the semiconductor buffer layer comprises epitaxially growing the semiconductor buffer layer from a middle layer of the bottom isolation structure.

4. The method of claim 2 further comprising forming a source or drain (S/D) region on the semiconductor buffer layer.

5. The method of claim 4, wherein the first region of the substrate is under the gate and the second region of the substrate is under the S/D region.

6. The method of claim 1, further comprising:
   forming a semiconductor buffer layer on a topmost surface of the bi-layer stack; and
   epitaxially growing a source or drain (S/D) region from a<100> surface of the semiconductor buffer layer.

7. The method of claim 1, wherein forming the bottom isolation structure comprises forming a top sacrificial layer, a middle sacrificial layer, and a bottom sacrificial layer over the substrate.

8. The method of claim 7, wherein the top sacrificial layer and the bottom sacrificial layer comprise silicon germanium having a germanium concentration of about 60 percent and the middle sacrificial layer comprises silicon germanium having a germanium concentration of about 25 percent.

9. The method of claim 7, wherein forming the bottom isolation structure further comprises:
   removing the top sacrificial layer and the bottom sacrificial layer selective to the middle sacrificial layer to form a cavity; and
   filling the cavity with dielectric material to form a top isolation layer and a bottom isolation layer.

10. The method of claim 9, wherein forming the bottom isolation structure further comprises:
    removing the middle sacrificial layer selective to the top isolation layer and bottom isolation layer to form a cavity; and
    filling the cavity with dielectric material to form a middle isolation layer.

11. A method for forming a semiconductor device, the method comprising:
    forming a bottom isolation structure over a substrate, the bottom isolation structure comprising a top sacrificial layer, a middle sacrificial layer, and a bottom top sacrificial layer, the top sacrificial layer and the bottom sacrificial layer comprising a first germanium content and the middle sacrificial layer comprising a second germanium content;
    forming a nanosheet stack over the bottom isolation structure;
    replacing the top sacrificial layer and the bottom sacrificial layer with dielectric material;
    exposing a surface of the middle sacrificial layer;
    forming a source or drain (S/D) region over the middle sacrificial layer; and
    replacing the middle sacrificial layer with dielectric material.

12. The method of claim 11, wherein replacing the top sacrificial layer and the bottom sacrificial layer comprises:
    removing the top sacrificial layer and the bottom sacrificial layer to define a first cavity; and
    forming a top isolation layer and a bottom isolation layer in the cavity, the top isolation layer and the bottom isolation layer comprising the dielectric material.

13. The method of claim 11, wherein replacing the middle sacrificial layer comprises:
    removing the middle sacrificial layer to define a second cavity; and
    forming a middle isolation layer in the second cavity, the middle isolation layer comprising the dielectric material.

14. The method of claim 11 further comprising forming a semiconductor buffer layer on the exposed surface of the middle sacrificial layer, wherein the semiconductor buffer layer is between the middle sacrificial layer and the S/D region.

15. The method of claim 14, wherein forming the S/D region comprises epitaxially growing the S/D region from a<100> surface of the semiconductor buffer layer.

16. The method of claim 11, wherein the bottom isolation structure comprises a tri-layer stack in a first region of the substrate and a bi-layer stack in a second region of the substrate.

17. The method of claim 16 further comprising forming a nanosheet stack over the bottom isolation structure in the first region of the substrate.

18. A semiconductor device comprising:
    a bottom isolation structure over a substrate, the bottom isolation structure comprising a tri-layer stack in a first region of the substrate and a bi-layer stack in a second region of the substrate;
    a nanosheet stack over the bottom isolation structure in the first region of the substrate;
    a semiconductor buffer layer on a surface of the bottom isolation structure in the second region of the substrate; and
    a source or drain (S/D) region on the semiconductor buffer layer.

19. The semiconductor device of claim 18 further comprising a gate over a channel region of the nanosheet stack.

20. The semiconductor device of claim 18, wherein the tri-layer stack of the bottom isolation structure comprises a nitride-oxide-nitride stack.

* * * * *